United States Patent
Yu

(10) Patent No.: US 7,408,386 B2
(45) Date of Patent: Aug. 5, 2008

(54) BOOTSTRAP INVERTER CIRCUIT

(75) Inventor: Jian-Shen Yu, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 15 days.

(21) Appl. No.: 11/427,162

(22) Filed: Jun. 28, 2006

(65) Prior Publication Data
US 2007/0188196 A1 Aug. 16, 2007

(30) Foreign Application Priority Data
Feb. 14, 2006 (TW) .............................. 95104911 A

(51) Int. Cl.
*H03K 19/094* (2006.01)
*H03K 19/0175* (2006.01)
(52) U.S. Cl. .............................. 326/88; 326/83; 326/87
(58) Field of Classification Search .................... 326/88, 326/87, 97, 83
See application file for complete search history.

(56) References Cited

U.S. PATENT DOCUMENTS

| | | |
|---|---|---|
| 3,286,189 A | 11/1966 | Mitchell et al. |
| 3,480,796 A | 11/1969 | Polkinghorn et al. |
| 3,872,321 A | 3/1975 | Matsue |
| 3,912,948 A | 10/1975 | Bapat |
| 4,065,678 A | 12/1977 | Reese et al. |
| 4,449,066 A | 5/1984 | Aoyama et al. |
| 4,484,092 A * | 11/1984 | Campbell, Jr. ................ 326/87 |
| 4,488,061 A * | 12/1984 | Mukawa et al. ................ 326/97 |
| 5,349,247 A * | 9/1994 | Hush et al. ..................... 326/88 |

FOREIGN PATENT DOCUMENTS

JP        61-007724        1/1986

* cited by examiner

*Primary Examiner*—Rexford Barnie
*Assistant Examiner*—Crystal L Hammond
(74) *Attorney, Agent, or Firm*—Patterson, Thuente, Skaar & Christensen, P.A.

(57) ABSTRACT

A bootstrap inverter circuit, consisting of transistors of the same type, comprises a first transistor, a second transistor, a voltage clamp circuit and an output end. The voltage clamp circuit, having a first node and a second node, controls the voltage of a gate of the second transistor. A gate and a first end of the first transistor are connected to a power source. A gate of the second transistor is connected to the second node of the voltage clamp circuit. A first end of the second transistor is connected to the power source. A second end of the second transistor is connected to the output end. The first node of the voltage clamp circuit is connected to the power source. The second node of the voltage clamp circuit is connected to a second end of the first transistor.

19 Claims, 8 Drawing Sheets

BOOTSTRAP INVERTER CIRCUIT

This application claims priority based on Taiwan Patent Application No. 095104911 filed on Feb. 14, 2006.

CROSS-REFERENCES TO RELATED APPLICATIONS

Not Applicable.

BACKGROUND OF THE INVENTION

1. Field of the Invention

The present invention relates to a bootstrap inverter circuit, specifically, to a bootstrap inverter circuit that decreases the voltage of the voltage raising point.

2. Descriptions of the Related Art

In recent years, thin-film transistor liquid crystal displays (TFT-LCD) have been widely utilized in personal computer displays, TVs, cell phones, digital cameras, etc. Generally, to reduce the cost of manufacturing, the single process technique, such as the PMOS or NMOS process, is utilized to simplify the process of manufacturing thin film transistor arrays. These thin film transistor arrays require a steady and higher driving voltage when used in a liquid crystal display. Therefore, a logic level of a general circuit must pass through a peripheral driving circuit so that it can be transformed into a higher voltage for providing a driving voltage for the liquid crystal display.

FIG. 1A illustrates a circuit diagram of a prior bootstrap inverter circuit. The bootstrap inverter circuit is composed of N-type transistors, which comprises an input end $V_{in}$, a first capacitor 101, a second capacitor 103, and an output end $V_{out}$. A contact point 105 in FIG. 1A is the voltage raising point of the bootstrap inverter circuit. Please refer to FIG. 1B where the symbol 107 represents a voltage waveform of the output end $V_{out}$ in FIG. 1A and the symbol 109 represents a voltage waveform of the contact point 105. The waveform in FIG. 1B is generated by setting the threshold voltage ($V_{th}$) to 4V in all N-type transistors, 20V as the first power source $V_{DD}$, 0V as the second power source $V_{SS}$, 0.2 pF as the first capacitor 101 and 1 pF as the second capacitor 103. When the input end $V_{in}$ inputs a low voltage signal, the voltage signal of the output end $V_{out}$ will be transformed into the voltage level of the first power source $V_{DD}$, and the voltage of the contact point 105 will be raised to the voltage level of ($2_{VDD}-V_{th}$), i.e. about 36V. Because the voltage level of the voltage rising point is so high, the structure of the transistors has a high likelihood of being damaged. Consequently, the stability and the reliability of the bootstrap inverter circuit would also be affected.

In conclusion, when a single TFT process technique is utilized to manufacture bootstrap inverter circuits, problems of high voltage levels in the voltage rising points may result. Consequently, it is important to find a way to decrease the voltage level of the voltage rising points, so that the stability and reliability of the circuits are not compromised.

SUMMARY OF THE INVENTION

The primary objective of this invention is to provide a bootstrap inverter circuit consisting of transistors of the same type. The bootstrap inverter circuit comprises a first transistor, a second transistor, a voltage clamp circuit and an output end. The first transistor has a gate, a first end, and a second end, while the second transistor has a gate, a first end, and a second end. The voltage clamp circuit has a first node and a second node for controlling the voltage of the gate of the second transistor. The gate and the first end of the first transistor are adapted to connect to a first power source, whereas the gate of the second transistor is connected to the second node of the voltage clamp circuit. The first end of the second transistor is adapted to connect to the first power source, while the second end of the second transistor is connected to the output end. Lastly, the first node of the voltage clamp circuit is adapted to connect to the first power source, while the second node of the voltage clamp circuit is connected to the second end of the first transistor.

Another objective of this invention is to provide a bootstrap inverter circuit composed of transistors of the same type, while the bootstrap inverter circuit comprises a first transistor, a second transistor, a stability transistor, a voltage clamp circuit and an output end. The structure is assembled as follows: (1) The first transistor has a gate, a first end, and a second end; (2) the second transistor has a gate, a first end, and a second end; (3) the stability transistor has a gate, a first end, and a second end and; (4) the voltage clamp circuit has a first and second node for controlling the voltage of the gate of the second transistor. For connectivity, the gate and the first end of the stability transistor are adapted to connect to a first power source, while the gate and the first end of the first transistor are connected to the second end of the stability transistor. The gate of the second transistor is connected to the second node of the voltage clamp circuit, where the first end of the second transistor is adapted to connect to the first power source and the second end of the second transistor is connected to the output end. Lastly, the first node of the voltage clamp circuit is adapted to connect to the first power source, while the second node of the voltage clamp circuit is connected to the second end of the first transistor.

The circuit of the present invention can also use the above-mentioned voltage clamp circuit to effectively reduce the voltage level of the voltage raising point of the bootstrap inverter circuit, i.e. the voltage level of the gate of the second transistor. Thus, the bootstrap inverter circuit can be stabilized.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
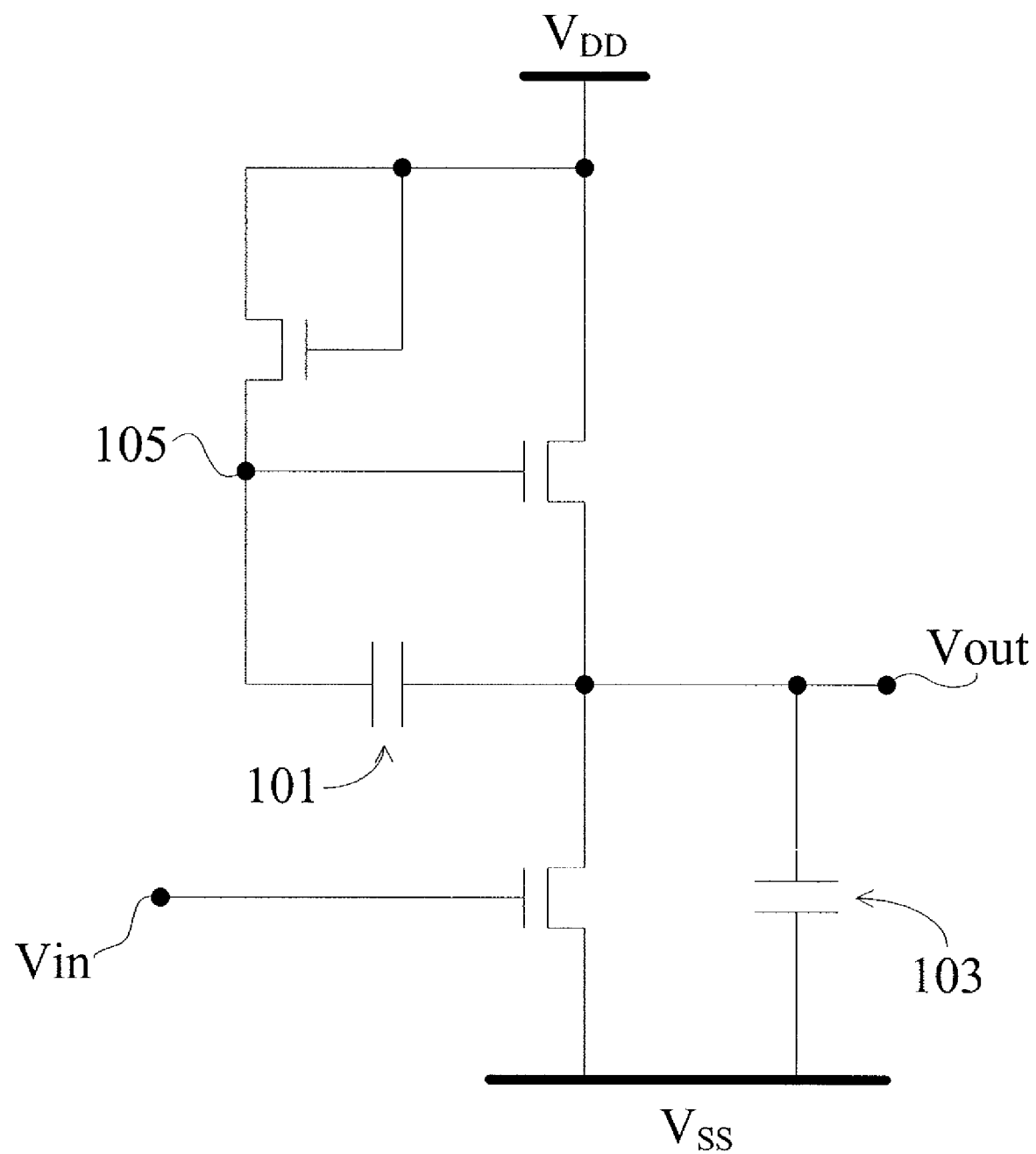
FIG. 1A illustrates a circuit diagram of a bootstrap inverter circuit of the prior art.
Figure 1B:
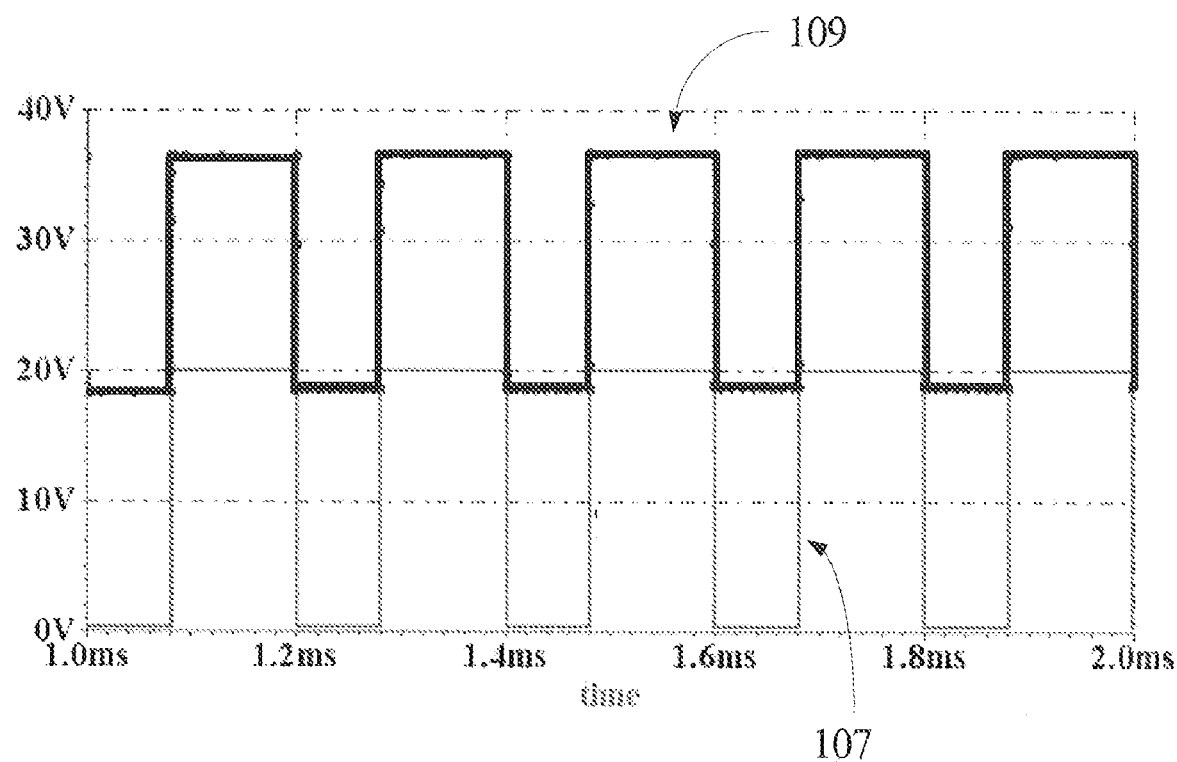
FIG. 1B illustrates a waveform diagram of both a voltage raising point and an output end of a bootstrap inverter circuit of the prior art.
Figure 2A:
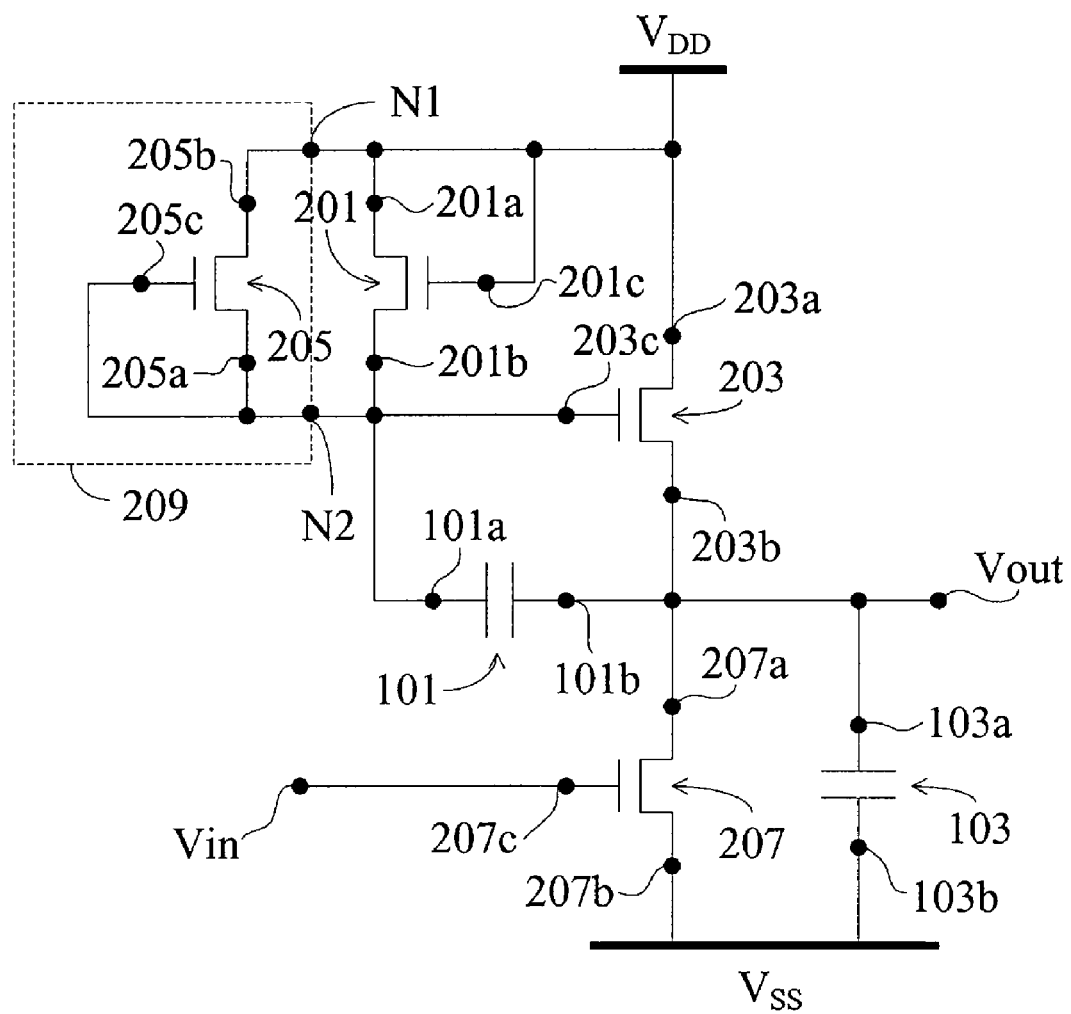
FIG. 2A illustrates a circuit diagram of a first embodiment of the prevent invention.

FIG. 2A shows a bootstrap inverter circuit of a first embodiment of the present invention. The bootstrap inverter circuit comprises an input end $V_{in}$, a first transistor 201, a second transistor 203, a voltage clamp circuit 209, an additional transistor 207, a first capacitor 101, a second capacitor 103, and an output end $V_{out}$. The input end $V_{in}$ is utilized to input a low voltage signal. The first transistor 201 has a gate 201c, a first end 201a, and a second end 201b. The second transistor 203 has a gate 203c, a first end 203a, and a second end 203b. The voltage clamp circuit 209 is composed of a third transistor 205 by a diode connection. The third transistor 205 has a gate 205c, a first end 205a, and a second end 205b. The additional transistor 207 has a gate 207c, a first end 207a, and a second end 207b. The first capacitor 101 has a first node 101a and a second node 101b. The second capacitor 103 has a first node 103a and a second node 103b. The first transistor 201, the second transistor 203, the third transistor 205 and the additional transistor 207 are either N-type or P-type thin film transistors.

The connection relationships of the first embodiment are described below. The gate 201c and the first end 201a of the first transistor 201 are adapted to connect to a first power source $V_{DD}$. The gate 203c of the second transistor 203 is connected to a second node N2 of the voltage clamp circuit 209, i.e. connected to the first end 205a of the third transistor 203. The first end 203a of the second transistor 203 is adapted to connect to the first power source $V_{DD}$. The second end 203b of the second transistor 203 is connected to the output end $V_{out}$. The first node N1 (that is, the second end 205b of the third transistor 205) of the voltage clamp circuit 209 is adapted to connect to the first power source $V_{DD}$. The second node N2 (that is, the first end 205a and the gate 205c of the third transistor 205) of the voltage clamp circuit 209 is connected to the second end 201b of the first transistor 201. The first node 101a of the first capacitor 101 is connected to the gate 203c of the second transistor 203. The second node 101b of the first capacitor 101 is connected to the output end $V_{out}$. The first end 207a of the additional transistor 207 is connected to the output end $V_{out}$. The gate 207c of the additional transistor 207 is connected to the input end $V_{in}$. The second end 207b of the additional transistor 207 is adapted to connect to a second power source $V_{SS}$. The first node 103a of the second capacitor 103 is connected to the output end $V_{out}$. The second node 103b of the second capacitor 103 is connected to the second power source $V_{SS}$. With regards to the above-mentioned connection relationship, the first capacitor 101 can be considered as a parasitic capacitance between the gate 203c of the second transistor 203 and the second end 203b, while the second capacitor 103 can be regarded as a load of the output end $V_{out}$.

Figure 2B:
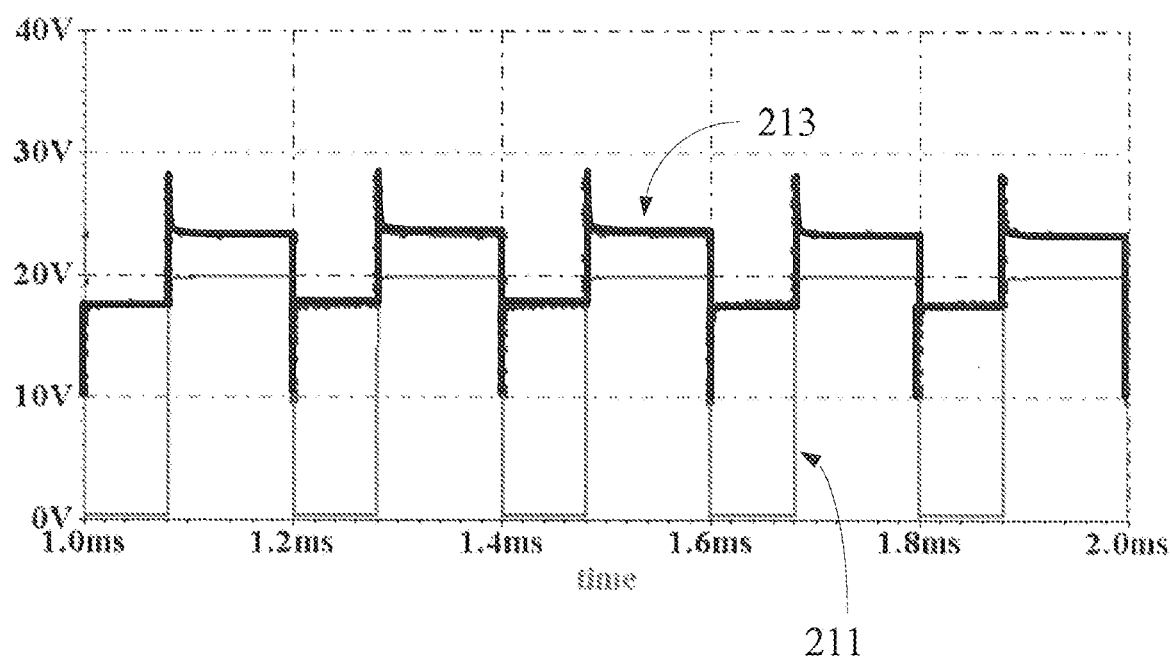
FIG. 2B illustrates a voltage waveform diagram of both a voltage raising point and an output end of a bootstrap inverter circuit of the first embodiment of the prevent invention.

The voltage raising point of the bootstrap inverter circuit is the second node N2 of the voltage clamp circuit 209. Please refer to FIG. 2B, where the symbol 211 represents a voltage waveform of the output end $V_{out}$ in FIG. 2A and the symbol 213 represents a voltage waveform of the voltage raising point N2. The waveform in FIG. 2B is generated by setting 4V as the threshold voltage of all the N-type transistors, 20V as the first power source $V_{DD}$, 0V as the second power source $V_{SS}$, 0.2 pF as the first capacitor 101, and 1 pF as the second capacitor 103. As shown in the waveform in FIG. 2B, the voltage of the voltage raising point N2 will be raised to the voltage level of $(V_{DD}+V_{th})$, i.e. about 24V. Thus, the problem of an increased voltage level of the voltage raising point in the prior art is solved.

Figure 3A:
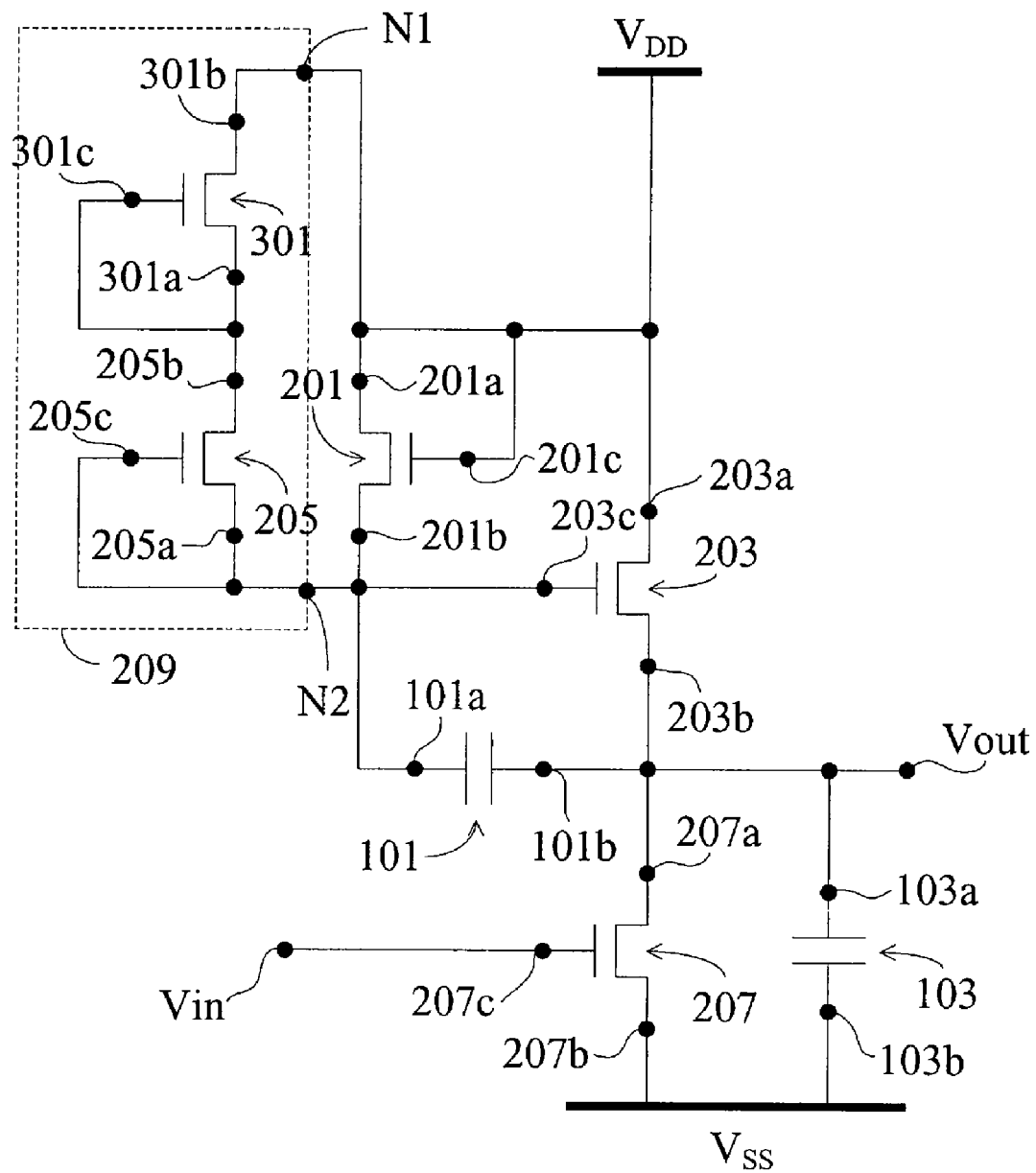
FIG. 3A illustrates a circuit diagram of a second embodiment of the prevent invention.

FIG. 3A shows a bootstrap inverter circuit of a second embodiment of the present invention while the bootstrap inverter circuit of this embodiment is substantially similar to that of the first embodiment. The difference between these two embodiments is the bootstrap inverter circuit 209 of the second embodiment further comprises a fourth transistor 301, having a gate 301c, a first end 301a, and a second end 301b. It is noted that the fourth transistor 301, first transistor 201, second transistor 203, third transistor 205, and fifth transistor 207 are thin film transistors of the same type. As shown in FIG. 3A, the first end 310a and the gate 310c of the fourth transistor 301 are connected to the second end 205b of the third transistor 205. On the other hand, the second end 205b of the third transistor 205 is not connected to the first end N1 of the voltage clamp circuit 209. Instead, the second end 301b of the fourth transistor 301 is connected to the first node N1. The third transistor 205 and the fourth transistor 301 control the gate voltage of the second transistor 203 by a diode connection.

Figure 3B:
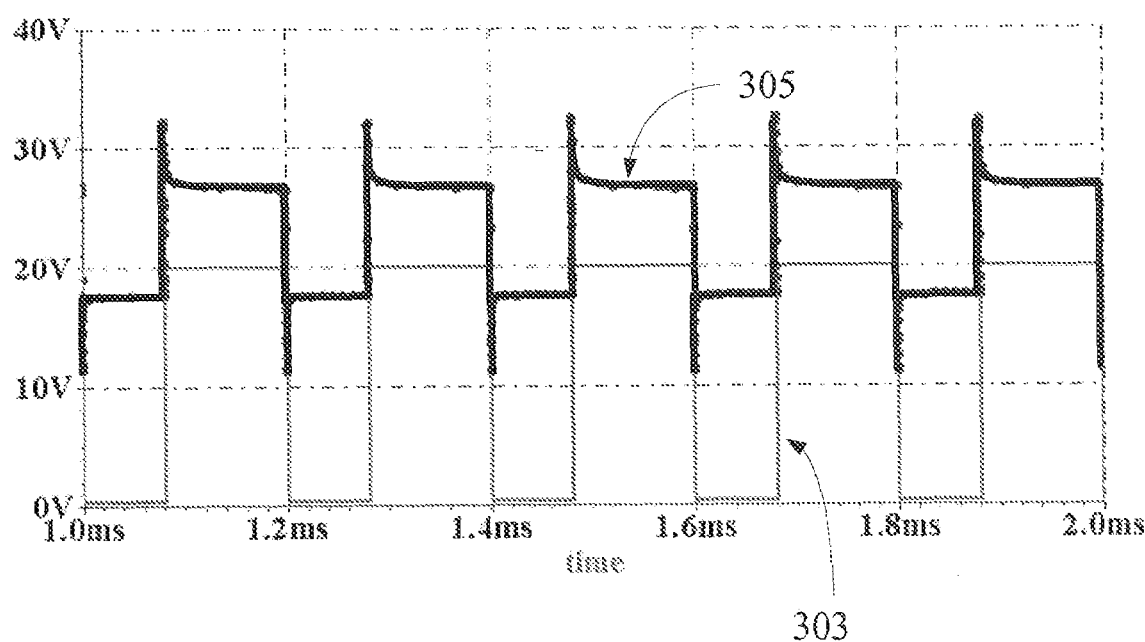
FIG. 3B illustrates a voltage waveform diagram of both a voltage raising point and an output end of a bootstrap inverter circuit of the second embodiment of the prevent invention.

Please refer to FIG. 3B, where the symbol 303 represents a voltage waveform of the output end $V_{out}$ in FIG. 3A and the symbol 305 represents a voltage waveform of the voltage raising point N2. The waveform in FIG. 3B is generated by setting 4V as the threshold voltage of all the N-type transistors, 20V as the first power source $V_{DD}$, 0V as the second power source $V_{SS}$, 0.2 pF as the first capacitor 101, and 1 pF as the second capacitor 103. As shown in the waveform in FIG. 3B, the voltage of the voltage raising point N2 will be raised to the voltage level of $(V_{DD}+2V_{th})$, i.e. about 28V. Compared with the first embodiment, the voltage of the voltage raising point illustrated in the second embodiment is slightly increased. However, the voltage clamp circuit 209 in the second embodiment enhances the capability of current supply of the second transistor 203 so that the circuit can respond more quickly.

Figure 4:
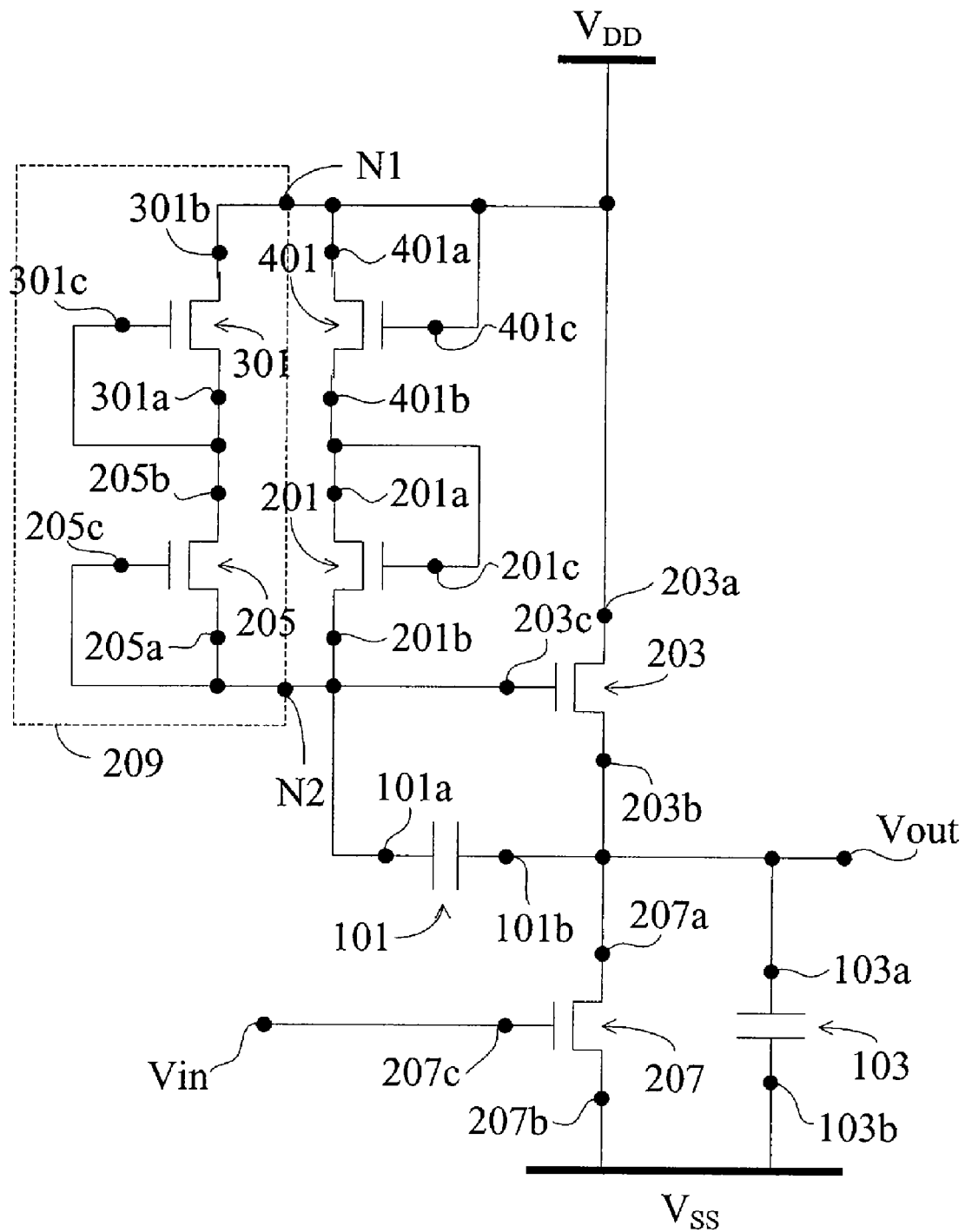
FIG. 4 illustrates a circuit diagram of a third embodiment of the prevent invention.

FIG. 4 shows a third embodiment of the present invention. The bootstrap inverter circuit of this embodiment is substantially similar to that of the second embodiment. The difference between these two embodiments is the bootstrap inverter circuit 209 of the second embodiment further comprises a stability transistor 401 which has a gate 401c, a first end 401a, and a second end 401b. It is noted that the stability transistor 401, first transistor 201, second transistor 203, third transistor 205, fourth transistor 301, and fifth transistor 207 are thin film transistors of the same type. As shown in FIG. 4, the gate 201c and the first end 201a of the first transistor 201 are not connected to the first end 203a of the second transistor 203 nor the first power source $V_{DD}$ in this embodiment. Instead, the gate 201c and the first end 201a of the first transistor 201 are connected to the second end 401b of the stability transistor 401, while the first node N1 of the voltage clamp circuit 209 and the first power source $V_{DD}$ are connected to the gate 401c and the first end 401a of the stability transistor 401. Lastly, the first end 203a of the second transistor 203 is connected to the gate 401c and the first end 401a of the stability transistor 401.

Figure 5:
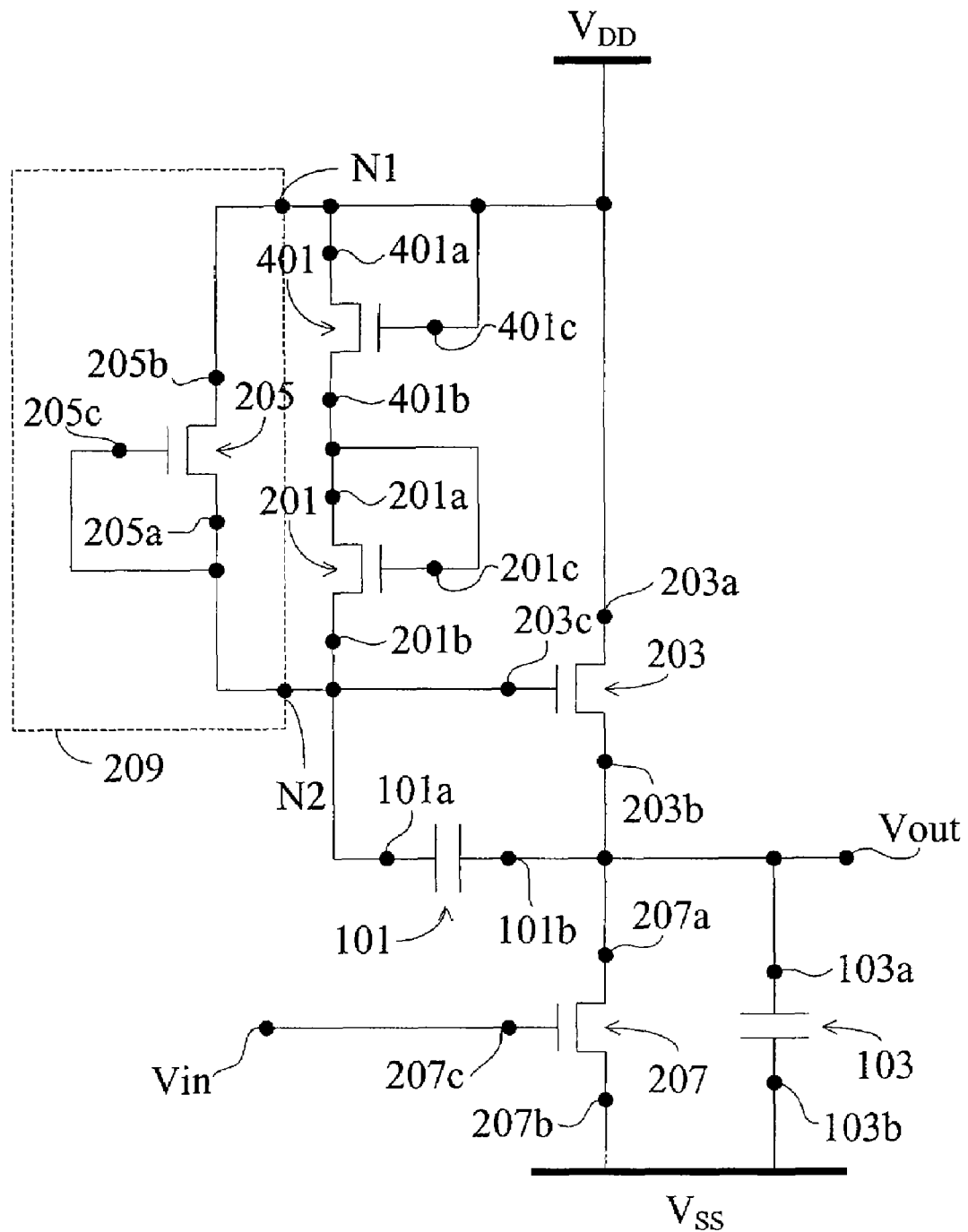
FIG. 5 illustrates a circuit diagram of a fourth embodiment of the prevent invention.

FIG. 5 shows a fourth embodiment of the present invention. The bootstrap inverter circuit of this embodiment is substantially similar to that of the third embodiment. The difference between the two is the bootstrap inverter circuit 209 of the fourth embodiment merely comprises the third transistor 205. More specifically, the second end 205b of the third transistor 205 is connected to the first end 401a and the gate 401c of the stability transistor 401. As for the connection relationships, those in the fourth embodiment are like those described in the first embodiment and FIG. 5; thus, no further details will be given here.

In conclusion, the prevent invention discloses a manufacturing method of a bootstrap inverter circuit using thin film transistors of the same type to reduce the voltage of the voltage raising point. Furthermore, the structure of the bootstrap inverter circuit of the prevent invention is simple and can be easily integrated into thin film transistor arrays. Consequently, the stability and the reliability of the circuit can be enhanced and the effects of simplifying the manufacturing process and reducing the thickness of the frames of a display can be achieved as well.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A bootstrap inverter circuit incorporating transistors of a same type, the bootstrap inverter circuit comprising:
   a first transistor having a gate, a first end, and a second end;
   a second transistor having a gate, a first end, and a second end;
   a voltage clamp circuit, having a first node and a second node, the voltage clamp circuit being arranged to control a voltage of the gate of the second transistor; and
   an output end,
   wherein the gate and the first end of the first transistor are operatively coupled to a first power node, the gate of the second transistor is connected to the second node of the voltage clamp circuit, the first end of the second transistor is operatively coupled to the first power node, the second end of the second transistor is connected to the output end, the first node of the voltage clamp circuit is operatively coupled to the first power node, and the second node of the voltage clamp circuit is connected to the second end of the first transistor; and
   wherein the voltage clamp circuit further comprises a third transistor having a gate, a first end, and a second end, wherein the second end of the third transistor is connected to the first node, and the gate and the first end of the third transistor are connected to the second node.

2. The bootstrap inverter circuit according to claim 1, further comprising:
   an input end;
   a first capacitor having a first node and a second node; and
   an additional transistor having a gate, a first end, and a second end,
   wherein the first node of the first capacitor is connected to the second node of the voltage clamp circuit, the second node of the first capacitor is connected to the output end, the first end of the additional transistor is connected to the output end, the gate of the additional transistor is connected to the input end, and the second end of the additional transistor is operatively connected to a second power node.

3. The bootstrap inverter circuit according to claim 2, further comprising a second capacitor, which includes a first node and a second node, the first node of the second capacitor is connected to the output end, and the second node of the second capacitor is operatively connected to the second power node.

4. The bootstrap inverter circuit according to claim 1, wherein the transistors are formed as a single type of transistor selected from the group consisting of either: N-type transistors, or P-type transistors.

5. The bootstrap inverter circuit according to claim 1, wherein the voltage clamp circuit controls the voltage of the gate of the second transistor by diode connection.

6. A bootstrap inverter circuit incorporating transistors of a same type, the bootstrap inverter circuit comprising:
   a first transistor having a gate, a first end, and a second end;
   a second transistor having a gate, a first end, and a second end;
   a voltage clamp circuit, having a first node and a second node, the voltage clamp circuit being arranged to control a voltage of the gate of the second transistor; and
   an output end,
   wherein the gate and the first end of the first transistor are operatively coupled to a first power node, the gate of the second transistor is connected to the second node of the voltage clamp circuit, the first end of the second transistor is operatively coupled to the first power node, the second end of the second transistor is connected to the output end, the first node of the voltage clamp circuit is operatively coupled to the first power node, and the second node of the voltage clamp circuit is connected to the second end of the first transistor; and
   Wherein the voltage clamp circuit further comprises:
   a third transistor having a gate, a first end, and a second end; and
   a fourth transistor having a gate, a first end, and a second end,
   wherein the gate and the first end of the third transistor are connected to the second node, the second end of the fourth transistor is connected to the first node, and the gate and the first end of the fourth transistor are connected to the third transistor.

7. The bootstrap inverter circuit according to claim 6, further comprising:
   an input end;
   a first capacitor having a first node and a second node; and
   a fifth transistor having a gate, a first end, and a second end,
   wherein the first node of the first capacitor is connected to the second node of the voltage clamp circuit, the second node of the first capacitor is connected to the output end, the first end of the fifth transistor is connected to the output end, the gate of the fifth transistor is connected to the input end, and the second end of the fifth transistor is operatively connected to a second power node.

8. The bootstrap inverter circuit according to claim 7, further comprising a second capacitor, which includes a first node and a second node, the first node of the second capacitor is connected to the output end, and the second node of the second capacitor is operatively connected to the second power node.

9. The bootstrap inverter circuit according to claim 6, wherein the transistors are formed as a single type of transistor selected from the group consisting of either: N-type transistors, or P-type transistors.

10. The bootstrap inverter circuit according to claim 6, wherein the voltage clamp circuit controls the voltage of the gate of the second transistor by diode connection.

11. A bootstrap inverter circuit incorporating transistors of same type, the bootstrap inverter circuit comprising:
    a first transistor having a gate, a first end, and a second end;
    a second transistor having a gate, a first end, and a second end;

a stability transistor having a gate, a first end, and a second end;

a voltage clamp circuit, having a first node and a second node, for controlling a voltage of the gate of the second transistor; and an output end, wherein the gate and the first end of the stability transistor are adapted to connect to a first power source, the gate and the first end of the first transistor are connected to the second end of the stability transistor, the gate of the second transistor is connected to the second node of the voltage clamp circuit, the first end of the second transistor is adapted to connect to the first power source, the second end of the second transistor is connected to the output end, the first node of the voltage clamp circuit is adapted to connect to the first power source, and the second node of the voltage clamp circuit is connected to the second end of the first transistor.

12. The bootstrap inverter circuit according to claim 11, wherein the voltage clamp circuit further comprises a third transistor having a gate, a first end, and a second end, while the second end of the third transistor is connected to the first node, and the gate and the first end of the third transistor are connected to the second node.

13. The bootstrap inverter circuit according to claim 12, further comprising:

an input end;

a first capacitor having a first node and a second node; and a fifth transistor having a gate, a first end, and a second end, wherein the first node of the first capacitor is connected to the second node of the voltage clamp circuit, the second node of the first capacitor is connected to the output end, the first end of the fifth transistor is connected to the output end, the gate of the fifth transistor is connected to the input end, and the second end of the fifth transistor is adapted to connect to a second power source.

14. The bootstrap inverter circuit according to claim 13, further comprising a second capacitor, which includes a first node and a second node, the first node of the second capacitor is connected to the output end, and the second node of the second capacitor is adapted to connect to the second power source.

15. The bootstrap inverter circuit according to claim 11, further comprising:

a third transistor having a gate, a first end, and a second end; and a fourth transistor having a gate, a first end, and a second end, wherein the gate and the first end of the third transistor are connected to the second node, the second end of the fourth transistor is connected to the first node, and the gate and the first end of the fourth transistor are connected to the second end of the third transistor.

16. The bootstrap inverter circuit according to claim 15, further comprising:

an input end;

a first capacitor having a first node and a second node; and a fifth transistor having a gate, a first end, and a second end, wherein the first node of the first capacitor is connected to the second node of the voltage clamp circuit, the second node of the first capacitor is connected to the output end, the first end of the fifth transistor is connected to the output end, the gate of the fifth transistor is connected to the input end, and the second end of the fifth transistor is adapted to connect to a second power source.

17. The bootstrap inverter circuit according to claim 16, further comprising a second capacitor, which includes a first node and a second node, the first node of the second capacitor is connected to the output end, and the second node of the second capacitor is adapted to connect to the second power source.

18. The bootstrap inverter circuit according to claim 11, wherein the transistors are formed as a single type of transistor selected from the group consisting of either: N-type transistors, or P-type transistors.

19. The bootstrap inverter circuit according to claim 11, wherein the voltage clamp circuit controls the voltage of the gate of the second transistor by diode connection.

* * * * *